United States Patent
Petronius et al.

(10) Patent No.: US 9,874,742 B2
(45) Date of Patent: Jan. 23, 2018

(54) MEMS REINFORCEMENT

(71) Applicant: Intel Corporation, Santa Clara, CA (US)

(72) Inventors: Israel Petronius, Haifa (IL); Barak Freedman, Yokneam (IL); Sagy Bareket, Haifa (IL); Arnon Hirshberg, D.N Misgav (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/865,757

(22) Filed: Sep. 25, 2015

(65) Prior Publication Data

US 2017/0090183 A1    Mar. 30, 2017

(51) Int. Cl.
| | |
|---|---|
| *G02B 26/08* | (2006.01) |
| *G02B 7/182* | (2006.01) |
| *H05K 1/02* | (2006.01) |
| *B81B 7/02* | (2006.01) |
| *H05K 1/11* | (2006.01) |

(52) U.S. Cl.
CPC .......... *G02B 26/0833* (2013.01); *B81B 7/02* (2013.01); *G02B 7/1821* (2013.01); *H05K 1/028* (2013.01); *H05K 1/111* (2013.01)

(58) Field of Classification Search
CPC .......... G02B 26/0833; G02B 26/0841; G02B 26/085; G02B 26/0858; G02B 26/0866; G02B 7/1821; B81B 3/0072; B81B 2201/042; B81B 2203/01; B81B 2203/06
USPC ............. 359/221.2–221.4, 224.1, 224.2
See application file for complete search history.

(56) References Cited

U.S. PATENT DOCUMENTS

| | | | | |
|---|---|---|---|---|
| 6,630,871 B2* | 10/2003 | Ma | ........................ | B81B 3/0078 331/116 M |
| 6,953,254 B2* | 10/2005 | Pesik | ....................... | G02B 5/08 359/223.1 |
| 7,259,900 B2* | 8/2007 | Orcutt | ..................... | B81B 3/007 359/200.7 |
| 7,417,779 B2* | 8/2008 | Orcutt | ..................... | B81B 3/007 359/198.1 |
| 7,547,883 B2* | 6/2009 | Chou | ..................... | B82Y 10/00 250/306 |
| 7,687,297 B2* | 3/2010 | Heck | ................... | B81C 1/00246 257/415 |
| 9,578,217 B2* | 2/2017 | Gutierrez | ............. | H04N 5/2253 |
| 2015/0177272 A1* | 6/2015 | Clark | .................... | G01P 15/097 850/5 |
| 2015/0181346 A1* | 6/2015 | Jingming | .................. | H04R 1/02 381/114 |
| 2015/0323456 A1* | 11/2015 | Agashe | ............... | B81C 1/00341 356/445 |

(Continued)

FOREIGN PATENT DOCUMENTS

JP          2014197061 A  * 10/2014  ............. G02B 26/10

*Primary Examiner* — Frank Font
(74) *Attorney, Agent, or Firm* — International IP Law Group, P.L.L.C.

(57) ABSTRACT

An apparatus for micro-electro-mechanical (MEMS) reinforcement is described herein. The apparatus includes a MEMS device and a stiffener. A micro scale mirror is to be embedded in a top layer of a substrate of the MEMS device. The stiffener is to be coupled to a back side of the MEMS device, wherein the stiffener is to stiffen the MEMS device via support of the MEMS device, without increasing a thickness of the MEMS device.

25 Claims, 8 Drawing Sheets

(56) References Cited

U.S. PATENT DOCUMENTS

| | | | |
|---|---|---|---|
| 2016/0007125 A1* | 1/2016 | Lee | H04R 31/003 |
| | | | 381/172 |
| 2016/0137488 A1* | 5/2016 | Jiang | B81B 7/0048 |
| | | | 257/414 |
| 2016/0167946 A1* | 6/2016 | Jenkins | B81B 3/0072 |
| | | | 257/416 |

* cited by examiner

300B

300C

MEMS REINFORCEMENT

FIELD

The present techniques generally relate to the field of optoelectronics. More specifically, the present techniques relate to a MEMS structure that is reinforced.

BACKGROUND

Optoelectronic systems include laser scanners, projectors, and other laser devices. These optoelectronic systems may include an infrared camera and an infrared laser projector to sense the depth of various objects within the system's field of view (FOV). The laser beams associated with depth sensing are deflected in a controlled manner by scanning mirrors within the system. The FOV may be limited by a mechanical form factor (physical dimensions) of the system. For example, laser projector units embedded in mobile devices may have stringent size limitations in order to fit into the mobile devices. Accordingly, the projector units may be designed taking into account stringent size limitations in the direction of projection, to allow embedding of the designed unit in mobile devices. To meet the stringent size limitations, laser devices with form factor restrictions may include Micro-Electro-Mechanical Systems (MEMS) scanning mirrors, silicon devices etched for specific mechanical shapes.

BRIEF DESCRIPTION OF THE DRAWINGS

In some cases, the same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
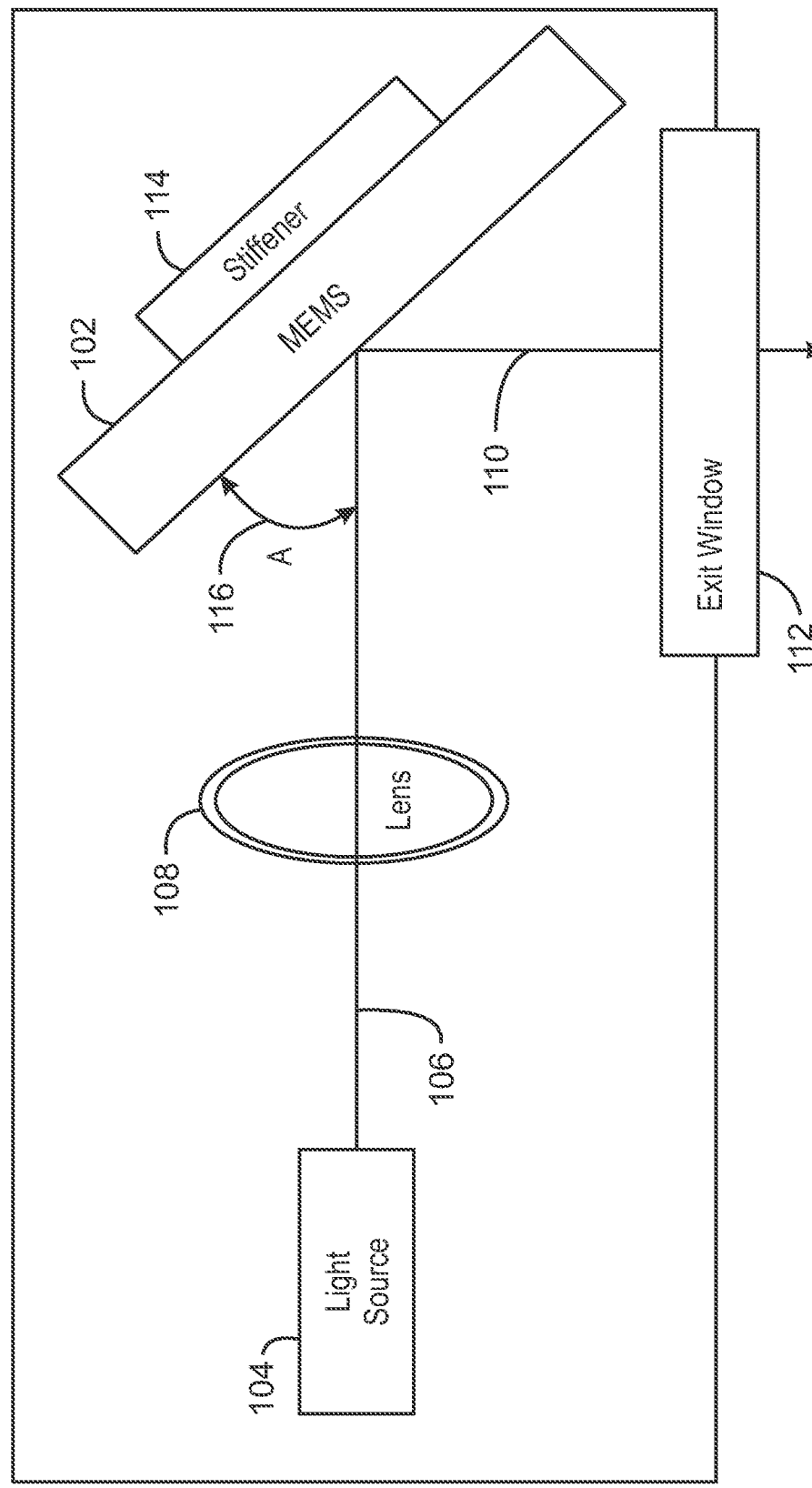
FIG. 1 is a block diagram of an optoelectronic device having a MEMS scanning mirror.

Integrating depth sensing technology within devices with small form factors can be achieved using MEMS-based scanning mirrors. MEMS devices typically range in size from few micrometers to a few millimeters. While the size of MEMS scanning mirrors make them easily integrated into devices with small form factors, the MEMS device can be quite thin and not well-suited for typical manufacturing processes. Notably, due to the small size and delicate nature of the MEMS scanning mirror, even very minor thermal/mechanical stress can impact the MEMS device performance.

Embodiments described herein generally provide a MEMS reinforcement. The reinforcement prevents deformation or bending of the MEMS device. Deformation or bending of the MEMS device may be due to thermal or mechanical strain. Mechanical strains may be the result of changes in temperature, pressure, and the like. Moreover, the MEMS reinforcement enables wire-bonding of the MEMS device prior to placement into a chassis of a computing device, thus simplifying manufacturing.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

FIG. 1 is a block diagram of an optoelectronic device 100 having a MEMS scanning mirror 102. In embodiments, as illustrated, the device 100 may include a laser device 104. In embodiments, the laser device 104 may be another light source such as an LED. The device 100 may be configured to provide an incident beam from the light source 104, through a lens 108 to a MEMS scanning mirror 102. In embodiments, the MEMS scanning mirror is a MEMS device with a mirror embedded in a top layer of a substrate of the MEMS device. An exit beam 110 with a required field of view is then projected from the MEMS scanning mirror 102 through an exit window 112 of the device 100. In general, the optoelectronic device 100 is embedded in a small form factor device. By applying a reinforcement to the MEMS 102, wire bonding may be done at the MEMS scanning mirror prior to assembly of the MEMS scanning mirror within a chassis of the small form factor device.

The optoelectronic device 100 may include a light source 104 configured to provide an incident light beam 106, in embodiments, an incident laser beam. In embodiments, the light source 104 may be disposed within the device 100, while in other embodiments the light source may be disposed outside of the device 100. The light source 104 may be configured to direct the incident beam 106 such that the beam 106 passes through an optical lens 108 and is received and deflected by the MEMS scanning mirror 102. The MEMS scanning mirror 102 may provide an enhanced field of view or otherwise meet a field of view requirement.

In embodiments, mirror of MEMS scanning mirror 102 may be made of silicon (Si), although in different materials providing required properties related to scanning mirror reflection qualities may be utilized in various embodiments. The MEMS scanning mirror 102 may be reinforced by a stiffener 114. The stiffener can be located on a portion of the MEMS scanning mirror 102 back surface, or across the entire back surface of the MEMS scanning mirror 102. Additionally, the stiffener 114 can be made from any rigid material, including but not limited to steel, ceramic, and the like. Through the application of a stiffener, a MEMS device can be made stronger and more ridged without increasing the thickness or size of the MEMS device.

In embodiments, the incident beam 106 may enter the MEMS scanning mirror 102, when the MEMS scanning mirror 102 is at a resting position as illustrated. In embodiments, the MEMS scanning mirror 102 has a resting position 116 angle A of substantially about 45 degrees. In embodiments, the resting position 116 may be up to 70 degrees or any other impinging angle. Other suitable angles A may be used in other embodiments. The MEMS scanning mirror 102, while in resting position 116, may deflect the incident beam 106 in a form of an exit beam 110 that may exit the optoelectronic device 100 through an exit window 112. In embodiments, the MEMS scanning mirror 102 may be configured to be rotatable or at least partially rotatable in order to deflect the incident beam 106 at a scanning angle that may correspond to a desired or required field of view (FOV) defined by the exit beams.

In embodiments, the optoelectronic device 100 may be configured to satisfy engineering requirements of a form factor during the optoelectronic assembly. For example, a width of the optoelectronic device 100 (i.e., its dimension parallel the direction of the exit beam 110) may be required to be within a range from about 2 millimeters (mm) to 5 mm. Wire bonding of the MEMS scanning mirror 102 may be implemented during the packaging of the MEMS scanning mirror 102. Wire bonding may refer to a method of making interconnections between an integrated circuit (IC) or other semiconductor device and its packaging during semiconductor device fabrication. A typical MEMS device is unable to be wire bonded due to the delicate nature of the MEMS device. By adding a stiffener, a MEMS device is able to be wire bonded without an increase in thickness of the MEMS device.

In embodiments, the optoelectronic device 100 described herein may include additional components in embodiments. For example, the optoelectronic device 100 can include a central processing unit (CPU) that is configured to execute stored instructions, as well as a memory device that stores instructions that are executable by the CPU. The memory may include any suitable volatile memory, such as suitable Dynamic Random Access Memory (DRAM), for example. The memory device may also include random access memory (RAM), read only memory (ROM), flash memory, or any other suitable memory systems.

The processor, memory, any other components, and the optoelectronic device 100 may be coupled with one or more interfaces (not shown) configured to facilitate information exchange among the above-mentioned components. Communications interface(s) (not shown) may provide an interface for the device 100 to communicate over one or more wired or wireless network(s) and/or with any other suitable device. In various embodiments, the optoelectronic device 100 may be, but is not limited to, a server, a workstation, a desktop computing device, or a mobile computing device (e.g., a laptop computing device, a handheld computing device, a handset, a tablet, a smartphone, a netbook, ultrabook, etc.).

In various embodiments, the device 100 may have more or less components, and/or different architectures. For example, in embodiments, the device 100 may include one or more of a camera, a keyboard, display such as a liquid crystal display (LCD) screen (including touch screen displays), a touchscreen controller, non-volatile memory port, antenna or multiple antennas, graphics chip, ASIC, speaker(s), a battery, an audio codec, a video codec, a power amplifier, a global positioning system (GPS) device, a compass, an accelerometer, a gyroscope, and the like. In various embodiments, the device 100 may have more or less components, and/or different architectures. In various embodiments, techniques and configurations described herein may be used in a variety of systems that benefit from the principles described herein such as optoelectronic, electro-optical, MEMS devices and systems, and the like.

Figure 2A:
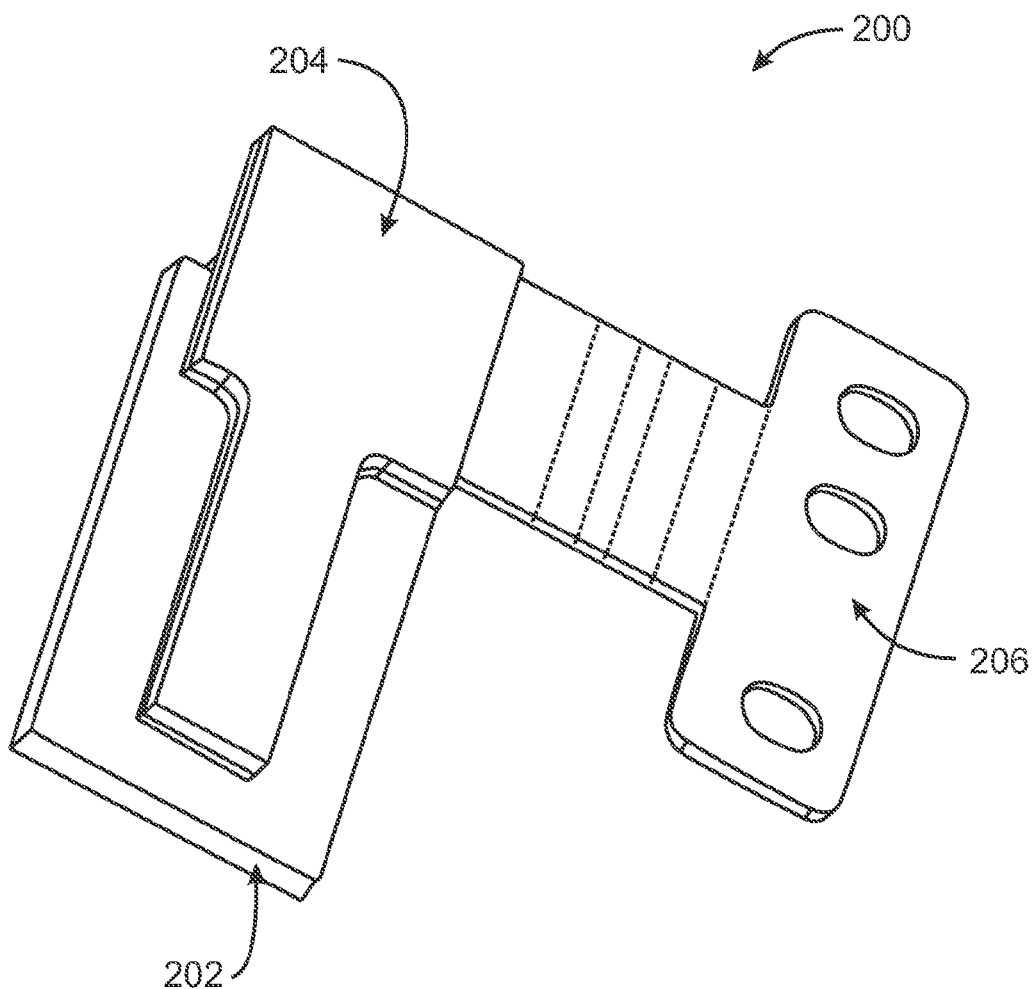
FIG. 2A is a back view of an assembly that includes a MEMS device and a stiffener.

FIG. 2A is a back view of an assembly 200 that includes a MEMS device and a stiffener. The MEMS device 202 may be a MEMS scanning mirror (102, FIG. 1) as described above. Further, the stiffener 204 may be a stiffener (114, FIG. 1) as described above. As illustrated, the stiffener 204 may be applied to a back surface of the MEMS device 202. The stiffener can be of any rigid material, such as plastic, steel, ceramic and the like. The stiffener 204 may be glued to the back surface of the MEMS, mechanically attached to the MEMS, or attached to the MEMS in any fashion. The thickness of the stiffener may be, for example, 300 micron. In embodiments, the thickness corresponds to the design of the MEMS device 202. The design or thickness of the stiffener is based on the design or thickness of the MEMS device.

In embodiments, a flexible printed circuit board (flex-PCB) 206 may be glued to the stiffener. The flex-PCB 206 may be glued to the stiffener 204 such that interconnection pads of the MEMS device 202 and interconnection pads of the flex-PCB are aligned. This alignment supports performing flex-PCB and MEMS die wire bonding prior to positioning the assembly 200 within the chassis of an electronic computing device. In this manner, the manufacturing process is made more robust, as wire-bonding can now be used to electrically couple the flex-PCB and the MEMS device. The manufacturing of an electro-optical device including a MEMS is not constrained by the typical small form factor of and electronic computing device.

Figure 2B:
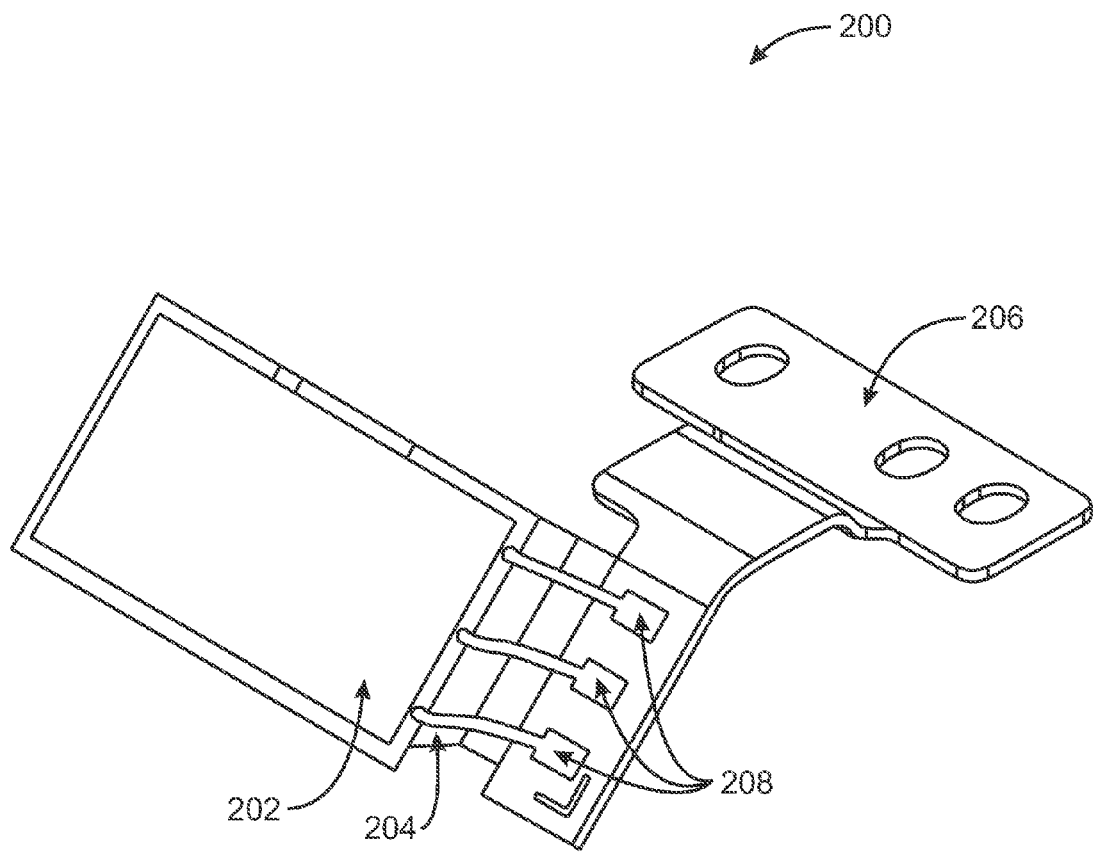
FIG. 2B is a front view of an assembly that includes a MEMS device and a stiffener.

FIG. 2B is a front view of an assembly 200 that includes a MEMS device and a stiffener. As illustrated, the stiffener 204 is applied to a portion of the back surface of the MEMS device 202. Thus, the stiffener 204 is partially obscured from view in FIG. 2A. The MEMS device 202 includes interconnection pads that are wire bonded with interconnect pads of the flex-PCB as illustrated at reference number 208.

The flex-PCB 206 includes various electronic circuits on a flexible plastic substrate. The flex-PCB may flex or conform to a desired shape within a chassis. This further enables the assembly 200 to be moveable. In embodiments, the assembly 200 is rotatable or at least partially rotatable. The flex-PCB also enables the MEMS device 202 to be included in the chassis of a small form factor device at a 45 degree angle.

Figure 3A:
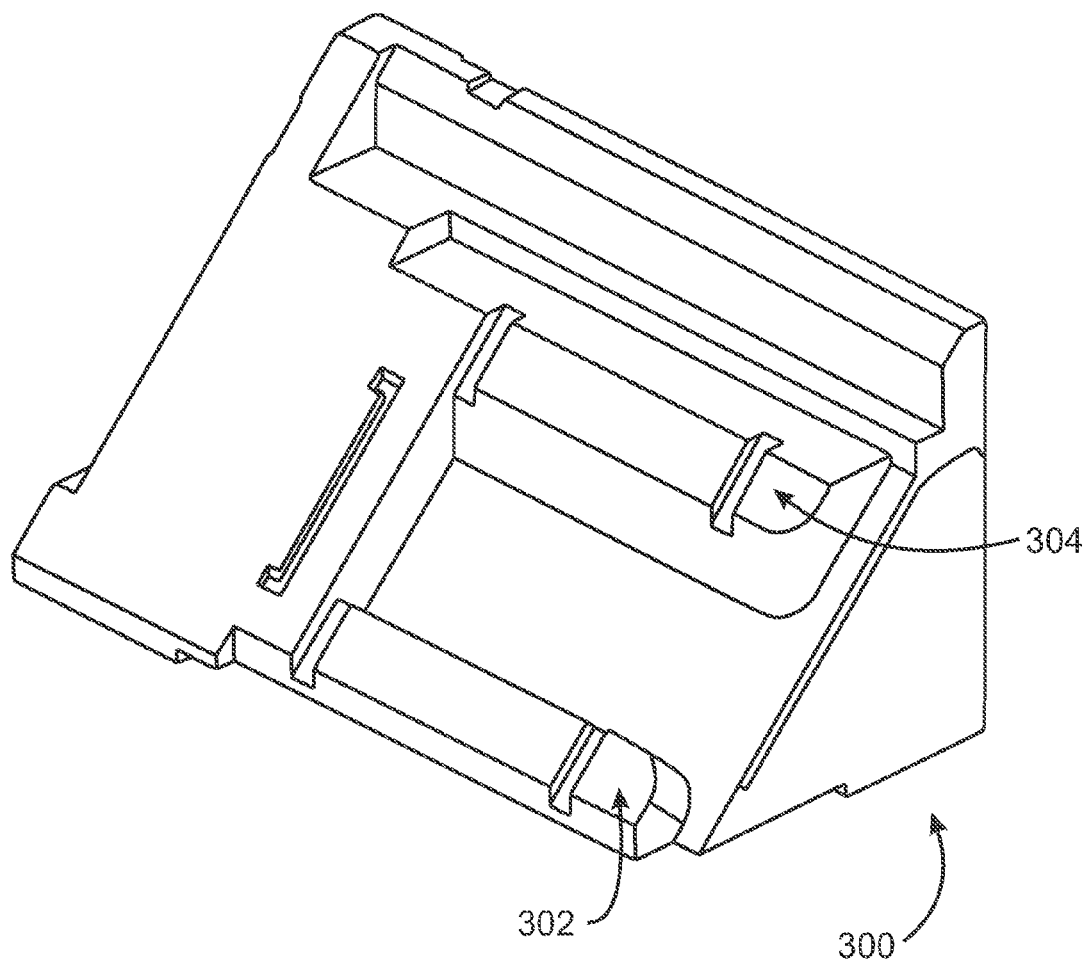
FIG. 3A is a perspective view of a support structure.

FIG. 3A is a perspective view of a support structure 300. The support structure 300 may be coupled to an assembly include a MEMS device, such as the MEMS device 102 and 202. The support structure can be formed from any material, and can be flexible or rigid. In embodiments, the support structure is a chassis. The support structure includes an element 302 and an element 304. The elements 302 and 304 are elongated in order to support the MEMS device and corresponding assembly within the chassis of a small form factor.

Figure 3B:
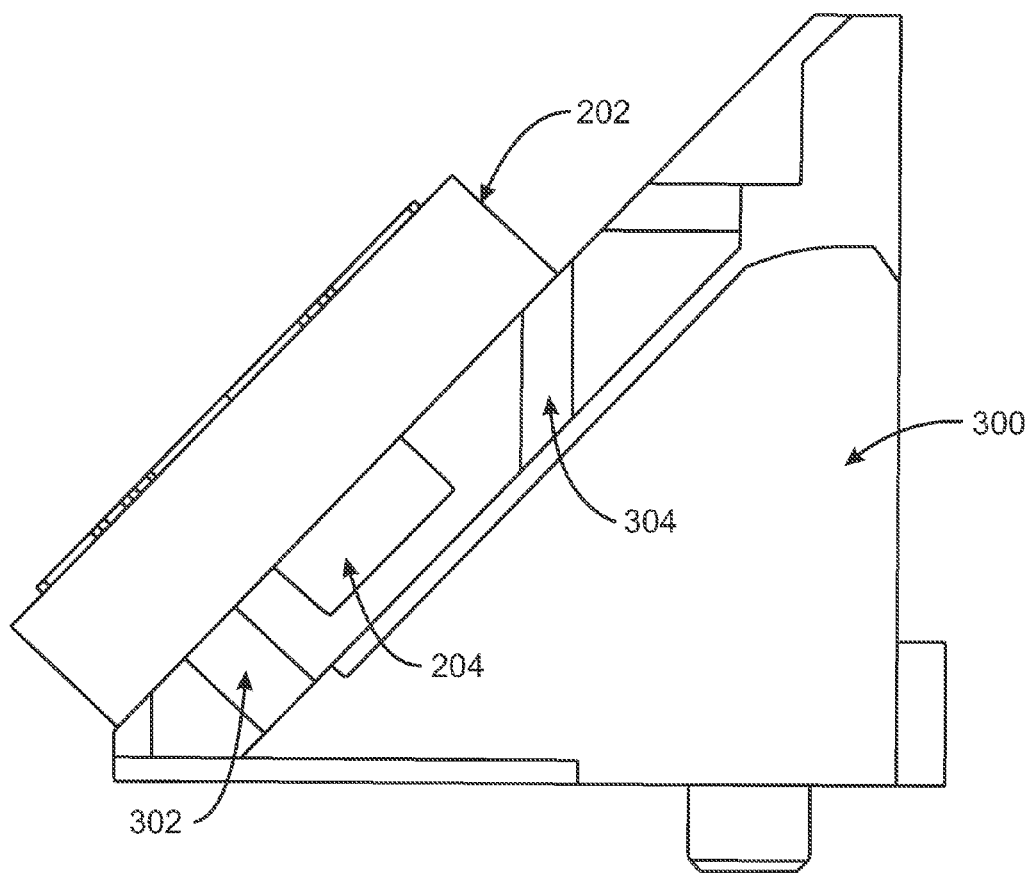
FIG. 3B is a side view of a support structure coupled with an assembly.

FIG. 3B is a cross section of a support structure 300 coupled with an assembly 200. As illustrated, the stiffener 204 is located between the support element 302 and the support element 304.

Figure 3C:
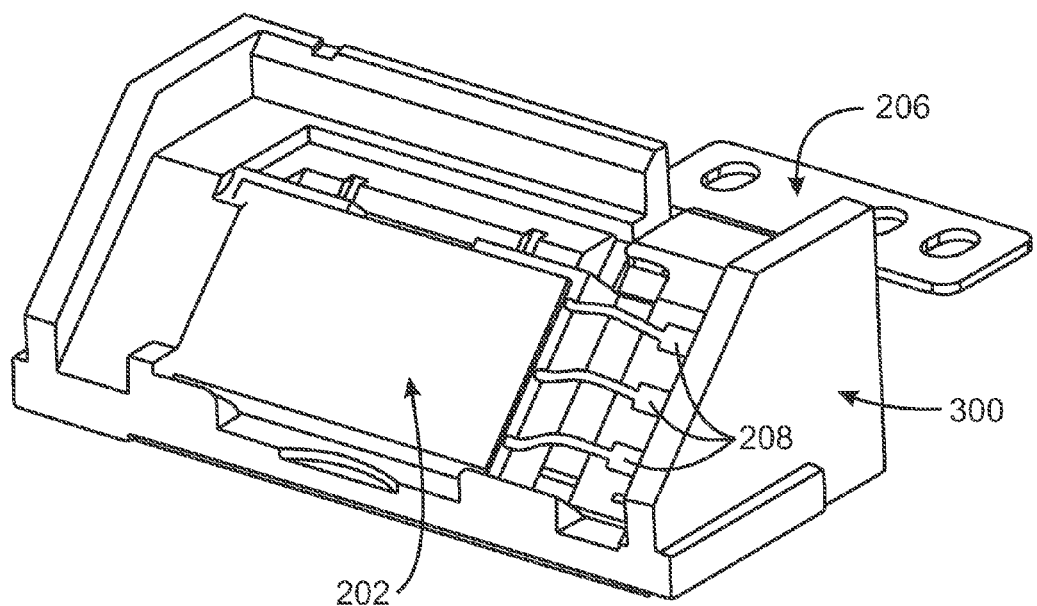
FIG. 3C is a perspective view of a support structure coupled with an assembly.

FIG. 3C is a perspective view of a support structure 300 coupled with an assembly 200. As illustrated, the MEMS device 202 is atop the support structure 300. The support structure 300 also provides support for the flex-PCB 206. The support enables wire-bonding to be performed while the MEMS device 202 is supported by a chassis, such as the support structure 300. Accordingly, the present techniques are advantageous compared to the option of using a thicker wafer for the MEMS, for example, in terms of cost and resulting dimensions. A thicker wafer may result in a thicker MEMS, which may not fit in the provided space.

Figure 4:
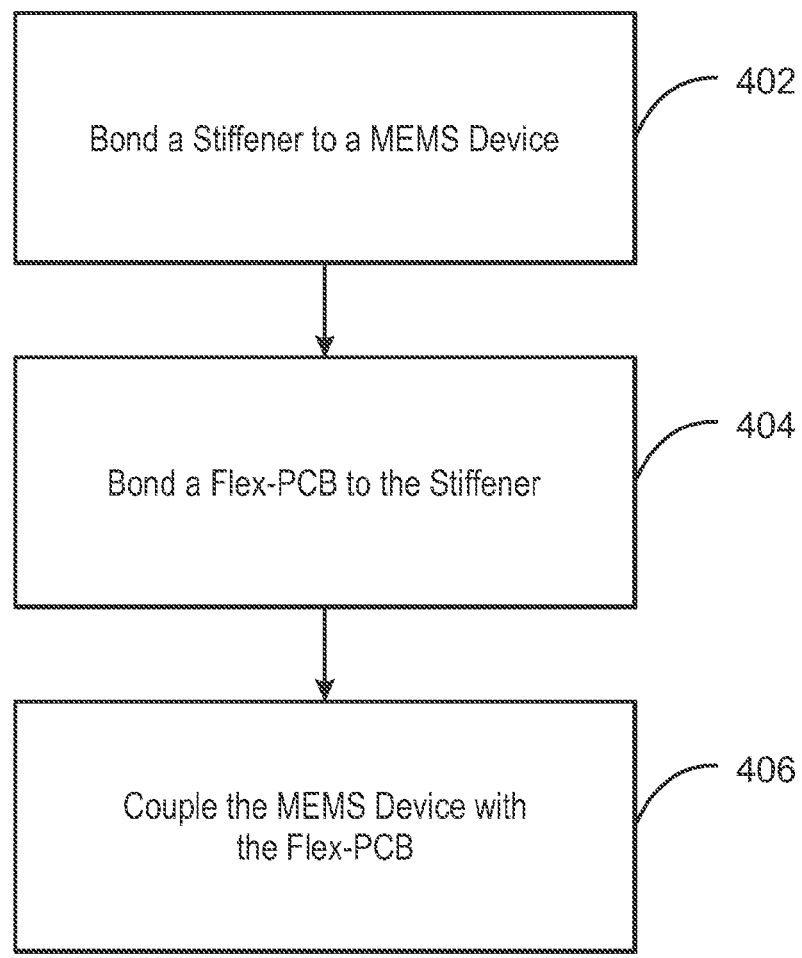
FIG. 4 is a process flow diagram of a method for MEMS reinforcement.

FIG. 4 is a process flow diagram of a method for MEMS reinforcement. At block 402, a stiffener is bonded with a flex-PCB. At block 404, the stiffener is bonded to a MEMS device. At block 406, the MEMS device is coupled with the flex-PCB. In embodiments, the MEMS stiffener is any rigid material. Moreover, the rigid material can be bonded to the MEMS device in any suitable fashion. Additionally, the flex-PCB can be coupled with the MEMS device via wire-bonding. The MEMS device and flex-PCB can be supported with a support structure.

Figure 5:
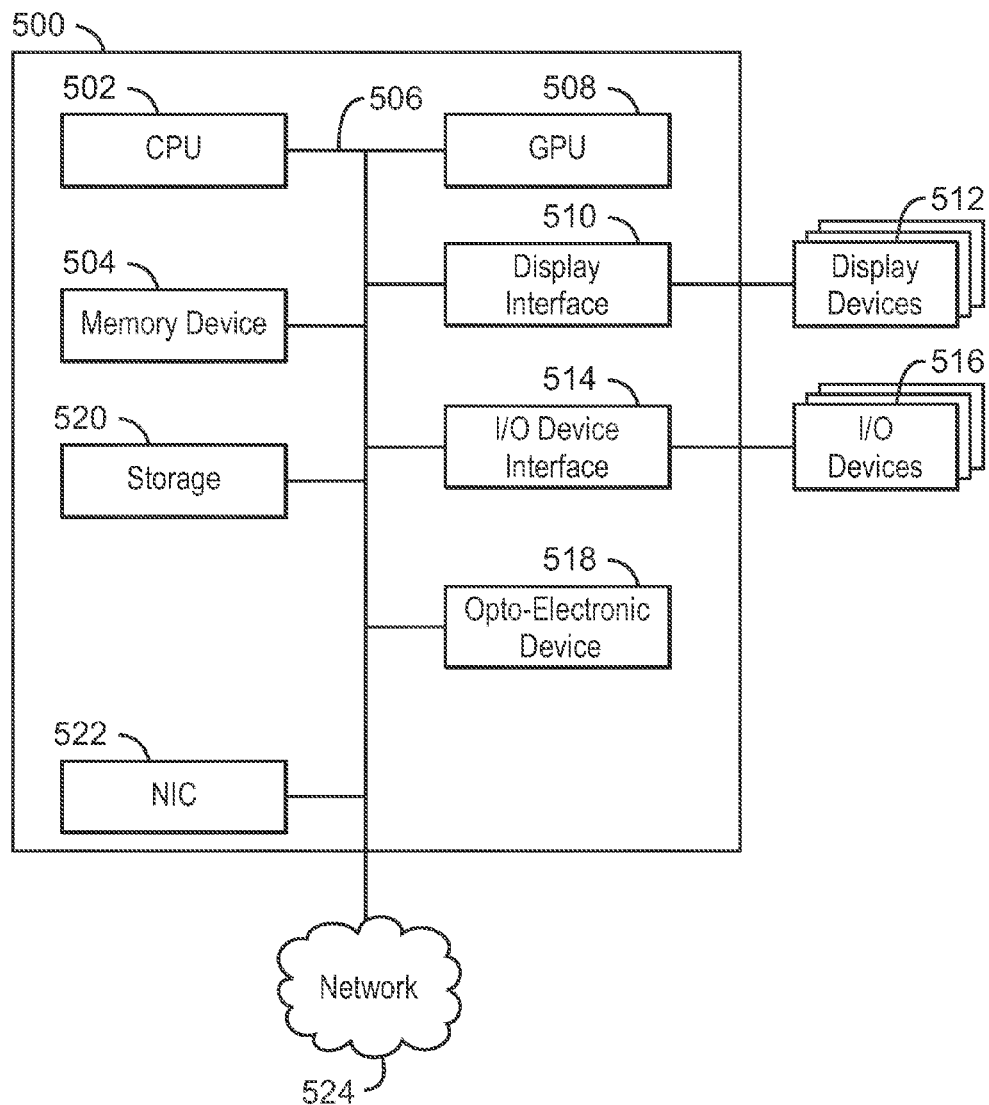
FIG. 5 is a block diagram of a computing device that includes a MEMS reinforcement.

FIG. 5 is a block diagram of a computing device 500 that includes a MEMS reinforcement. The computing device 500 can be, for example, a laptop computer, desktop computer, tablet computer, mobile device, or server, among others. In particular, the computing device 500 can be a mobile device such as a cellular phone, a smartphone, a personal digital assistant (PDA), phablet, or a tablet. The computing device 500 can include a central processing unit (CPU) 502 that is configured to execute stored instructions, as well as a memory device 504 that stores instructions that are executable by the CPU 502. The CPU can be coupled to the memory device 504 by a bus 506. Additionally, the CPU 502 can be a single core processor, a multi-core processor, a computing cluster, or any number of other configurations. Furthermore, the computing device 500 can include more than one CPU 502. The memory device 504 can include random access memory (RAM), read only memory (ROM), flash memory, or any other suitable memory systems. For example, the memory device 504 can include dynamic random access memory (DRAM).

The computing device 500 can also include a graphics processing unit (GPU) 508. As shown, the CPU 502 can be coupled through the bus 506 to the GPU 508. The GPU 508 can be configured to perform any number of graphics operations within the computing device 500. For example, the GPU 508 can be configured to render or manipulate graphics images, graphics frames, videos, or the like, to be displayed to a user of the computing device 500. In embodiments, the GPU 508 includes a number of graphics engines, wherein each graphics engine is configured to perform specific graphics tasks, or to execute specific types of workloads.

The CPU 502 can be linked through the bus 506 to a display interface 510 configured to connect the computing device 500 to a display device 512. The display device 512 can include a display screen that is a built-in component of the computing device 500. The display device 512 can also include a computer monitor, television, or projector, among others, that is externally connected to the computing device 500.

The CPU 502 can also be connected through the bus 506 to an input/output (I/O) device interface 514 configured to connect the computing device 500 to one or more I/O devices 516. The I/O devices 516 can include, for example, a keyboard and a pointing device, wherein the pointing device can include a touchpad or a touchscreen, among others. The I/O devices 516 can be built-in components of the computing device 500, or can be devices that are externally connected to the computing device 500.

The computing device 500 may also include also includes an optoelectronic device 518. The optoelectronic device 518 may be a still shot camera, 3D camera, video recording device, and the like. In embodiments, the optoelectronic device 518 also includes an infrared device. The optoelectronic device 518 may also include a MEMS reinforced device as descried herein. The computing device also includes a storage device 520. The storage device 520 is a physical memory such as a hard drive, a solid state drive, an optical drive, a thumbdrive, an array of drives, or any combinations thereof. The storage device 520 can also include remote storage drives such as used for cloud computing applications. The storage device 520 includes any number of applications that are configured to run on the computing device 500.

The computing device 500 can also include a network interface controller (NIC) 522. The NIC 522 can be configured to connect the computing device 500 through the bus 506 to a network 524. The network 524 can be a wide area network (WAN), local area network (LAN), or the Internet, among others.

Example 1 is an apparatus for mirco-electro-mechanical (MEMS) reinforcement. The apparatus includes a MEMS device, wherein a micro scale mirror is to be embedded in a top layer of a substrate of the MEMS device; and a stiffener to be coupled to a back side of the MEMS device, wherein the stiffener is to stiffen the MEMS device via support of the MEMS device, without increasing a thickness of the MEMS device.

Example 2 includes the apparatus of example 1, including or excluding optional features. In this example, the stiffener comprises steel, ceramic, or any other rigid material.

Example 3 includes the apparatus of any one of examples 1 to 2, including or excluding optional features. In this example, the stiffener completely covers the back side of the MEMS device.

Example 4 includes the apparatus of any one of examples 1 to 3, including or excluding optional features. In this example, the stiffener covers a portion of the back side of the MEMS device.

Example 5 includes the apparatus of any one of examples 1 to 4, including or excluding optional features. In this example, the stiffener has a T shape.

Example 6 includes the apparatus of any one of examples 1 to 5, including or excluding optional features. In this example, the apparatus includes a flexible printed circuit board, wherein the flexible printed circuit board is coupled with the stiffener such that an interconnection pad of the MEMS device and an interconnection pad of the flexible printed circuit board are aligned.

Example 7 includes the apparatus of any one of examples 1 to 6, including or excluding optional features. In this example, the apparatus includes a support structure, wherein the support structure is to enable assembly in a chassis at a 45 degree angle.

Example 8 includes the apparatus of any one of examples 1 to 7, including or excluding optional features. In this example, the stiffener is to prevent deformation of the MEMS device.

Example 9 includes the apparatus of any one of examples 1 to 8, including or excluding optional features. In this example, the MEMS device is a MEMS scanning mirror.

Example 10 includes the apparatus of any one of examples 1 to 9, including or excluding optional features. In this example, the MEMS device is at least partially rotatable.

Example 11 is a system for mirco-electro-mechanical (MEMS) reinforcement. The system includes an optoelectronic device associated with a laser device, wherein the device includes a MEMS scanning mirror and the MEMS scanning mirror includes a micro scale mirror is to be embedded in a top layer of a substrate; a stiffener coupled to a back side of the MEMS scanning mirror, wherein the stiffener is to stiffen the MEMS scanning mirror via support of the MEMS scanning mirror, without increasing a thickness of the MEMS scanning mirror.

Example 12 includes the system of example 11, including or excluding optional features. In this example, the stiffener comprises steel, ceramic, or any other rigid material.

Example 13 includes the system of any one of examples 11 to 12, including or excluding optional features. In this example, the stiffener completely covers the back side of the MEMS scanning mirror.

Example 14 includes the system of any one of examples 11 to 13, including or excluding optional features. In this example, the stiffener covers a portion of the back side of the MEMS scanning mirror.

Example 15 includes the system of any one of examples 11 to 14, including or excluding optional features. In this example, the stiffener has a T shape.

Example 16 includes the system of any one of examples 11 to 15, including or excluding optional features. In this example, the system includes a flexible printed circuit board, wherein the flexible printed circuit board is coupled with the stiffener such that an interconnection pad of the MEMS scanning mirror and an interconnection pad of the flexible printed circuit board are aligned.

Example 17 includes the system of any one of examples 11 to 16, including or excluding optional features. In this example, the system includes a support structure, wherein the support structure is to enable assembly in a chassis at a 45 degree angle.

Example 18 includes the system of any one of examples 11 to 17, including or excluding optional features. In this example, the stiffener is to prevent deformation of the MEMS scanning mirror.

Example 19 includes the system of any one of examples 11 to 18, including or excluding optional features. In this example, the stiffener is glued to the back side of the MEMS scanning mirror.

Example 20 includes the system of any one of examples 11 to 19, including or excluding optional features. In this example, the MEMS scanning mirror is at least partially rotatable.

Example 21 is a method for micro-electro-mechanical (MEMS) reinforcement. The method includes bonding a stiffener to a MEMS device; bonding a flexible printed circuit board to the stiffener; and coupling the MEMS device with the flexible printed circuit board.

Example 22 includes the method of example 21, including or excluding optional features. In this example, the stiffener comprises steel, ceramic, or any other rigid material.

Example 23 includes the method of any one of examples 21 to 22, including or excluding optional features. In this example, the stiffener completely covers the back side of the MEMS device.

Example 24 includes the method of any one of examples 21 to 23, including or excluding optional features. In this example, the stiffener covers a portion of the back side of the MEMS device.

Example 25 includes the method of any one of examples 21 to 24, including or excluding optional features. In this example, the stiffener has a T shape.

Example 26 includes the method of any one of examples 21 to 25, including or excluding optional features. In this example, the flexible printed circuit board is bonded with the stiffener such that an interconnection pad of the MEMS device and an interconnection pad of the flexible printed circuit board are aligned.

Example 27 includes the method of any one of examples 21 to 26, including or excluding optional features. In this example, the method includes a support structure, wherein the support structure is to enable assembly in a chassis at a 45 degree angle.

Example 28 includes the method of any one of examples 21 to 27, including or excluding optional features. In this example, the stiffener is to prevent deformation of the MEMS device.

Example 29 includes the method of any one of examples 21 to 28, including or excluding optional features. In this example, the stiffener is glued to the back side of the MEMS device.

Example 30 includes the method of any one of examples 21 to 29, including or excluding optional features. In this example, the MEMS device is at least partially rotatable.

Example 31 is an apparatus for micro-electro-mechanical (MEMS) reinforcement. The apparatus includes a MEMS device, wherein a micro scale mirror is to be embedded in a top layer of a substrate of the MEMS device; and a means to reinforce to be coupled to a back side of the MEMS device, wherein the means to reinforce is to stiffen the MEMS device via support of the MEMS device, without increasing a thickness of the MEMS device.

Example 32 includes the apparatus of example 31, including or excluding optional features. In this example, the means to reinforce comprises steel, ceramic, or any other rigid material.

Example 33 includes the apparatus of any one of examples 31 to 32, including or excluding optional features. In this example, the means to reinforce completely covers the back side of the MEMS device.

Example 34 includes the apparatus of any one of examples 31 to 33, including or excluding optional features. In this example, the means to reinforce covers a portion of the back side of the MEMS device.

Example 35 includes the apparatus of any one of examples 31 to 34, including or excluding optional features. In this example, the means to reinforce has a T shape.

Example 36 includes the apparatus of any one of examples 31 to 35, including or excluding optional features. In this example, the apparatus includes a flexible printed circuit board, wherein the flexible printed circuit board is coupled with the means to reinforce such that an interconnection pad of the MEMS device and an interconnection pad of the flexible printed circuit board are aligned.

Example 37 includes the apparatus of any one of examples 31 to 36, including or excluding optional features. In this example, the apparatus includes a support structure, wherein the support structure is to enable assembly in a chassis at a 45 degree angle.

Example 38 includes the apparatus of any one of examples 31 to 37, including or excluding optional features. In this example, the means to reinforce is to prevent deformation of the MEMS device.

Example 39 includes the apparatus of any one of examples 31 to 38, including or excluding optional features. In this example, the MEMS device is a MEMS scanning mirror.

Example 40 includes the apparatus of any one of examples 31 to 39, including or excluding optional features. In this example, the MEMS device is at least partially rotatable.

In the foregoing description, numerous specific details have been set forth, such as examples of specific types of system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

In the above description and the following claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices.

An embodiment is an implementation or example. Reference in the present specification to "an embodiment", "one embodiment", "some embodiments", "various embodiments", or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An apparatus for micro-electro-mechanical (MEMS) reinforcement, comprising:
    a MEMS device, wherein a micro scale mirror is to be embedded in a top layer of a substrate of the MEMS device and the MEMS device is at least partially rotatable; and
    a stiffener to be coupled to a back side of the MEMS device, wherein the stiffener is to stiffen the MEMS device via support of the MEMS device, without increasing a thickness of the MEMS device.

2. The apparatus of claim 1, wherein the stiffener comprises steel, ceramic, or any other rigid material.

3. The apparatus of claim 1, wherein the stiffener completely covers the back side of the MEMS device.

4. The apparatus of claim 1, wherein the stiffener covers a portion of the back side of the MEMS device.

5. The apparatus of claim 1, wherein the stiffener has a T shape.

6. The apparatus of claim 1, further comprising a flexible printed circuit board, wherein the flexible printed circuit board is coupled with the stiffener such that an interconnection pad of the MEMS device and an interconnection pad of the flexible printed circuit board are aligned.

7. The apparatus of claim 1, further comprising a support structure, wherein the support structure is to enable assembly of the micro scale mirror in a chassis at a 45 degree angle relative to an incident beam.

8. The apparatus of claim 1, wherein the stiffener is to prevent deformation of the MEMS device.

9. The apparatus of claim 1, wherein the MEMS device is a MEMS scanning mirror.

10. The apparatus of claim 1, wherein the stiffener enables wire bonding of the MEMS device and a flexible printed circuit board prior to assembly within a chassis of a computing device.

11. A system for micro-electro-mechanical (MEMS) reinforcement, comprising:
    an optoelectronic device associated with a laser device, wherein the optoelectronic device includes a MEMS scanning mirror and the MEMS scanning mirror comprises a micro scale mirror that is configured to be at least partially rotatable and is embedded in a top layer of a substrate;
    a stiffener coupled to a back side of the MEMS scanning mirror, wherein the stiffener is to stiffen the MEMS scanning mirror via support of the MEMS scanning mirror, without increasing a thickness of the MEMS scanning mirror.

12. The system of claim 11, wherein the stiffener comprises steel, ceramic, or any other rigid material.

13. The system of claim 11, wherein the stiffener completely covers the back side of the MEMS scanning mirror.

14. The system of claim 11, wherein the stiffener covers a portion of the back side of the MEMS scanning mirror.

15. The system of claim 11, wherein the stiffener has a T shape.

16. The system of claim 11, further comprising a flexible printed circuit board, wherein the flexible printed circuit board is coupled with the stiffener such that an interconnection pad of the MEMS scanning mirror and an interconnection pad of the flexible printed circuit board are aligned.

17. A method for micro-electro-mechanical (MEMS) reinforcement, comprising:
   bonding a stiffener to a MEMS device;
   bonding a flexible printed circuit board to the stiffener; and
   coupling the MEMS device with the flexible printed circuit board, wherein the MEMS device comprises a micro scale mirror embedded in a top layer of a substrate of the MEMS device that is configured to be at least partially rotatable.

18. The method of claim 17, wherein the stiffener comprises steel, ceramic, or any other rigid material.

19. The method of claim 17, wherein the stiffener completely covers the back side of the MEMS device.

20. The method of claim 17, wherein the stiffener covers a portion of the back side of the MEMS device.

21. The method of claim 17, wherein the stiffener has a T shape.

22. The method of claim 17, wherein the flexible printed circuit board is bonded with the stiffener such that an interconnection pad of the MEMS device and an interconnection pad of the flexible printed circuit board are aligned.

23. The method of claim 17, further comprising a support structure, wherein the support structure is to enable assembly of the micro scale mirror in a chassis at a 45 degree angle relative to an incident beam.

24. The method of claim 17, wherein the stiffener is to prevent deformation of the MEMS device.

25. The method of claim 17, wherein the stiffener is glued to the back side of the MEMS device.

* * * * *